United States Patent
Tsuchiya (10) Patent No.: US 10,600,837 B2
(45) Date of Patent: Mar. 24, 2020

(54) ELECTRIC FIELD IMAGING DEVICE

(71) Applicant: NATIONAL INSTITUTE OF INFORMATION AND COMMUNICATIONS TECHNOLOGY, Tokyo (JP)

(72) Inventor: Masahiro Tsuchiya, Tokyo (JP)

(73) Assignee: NATIONAL INSTITUTE OF INFORMATION AND COMMUNICATIONS TECHNOLOGY, Tokyo (JP)

( * ) Notice: Subject to any disclaimer, the term of this patent is extended or adjusted under 35 U.S.C. 154(b) by 0 days.

(21) Appl. No.: 16/081,732

(22) PCT Filed: Feb. 6, 2017

(86) PCT No.: PCT/JP2017/004151
§ 371 (c)(1),
(2) Date: Dec. 31, 2018

(87) PCT Pub. No.: WO2017/150078
PCT Pub. Date: Sep. 8, 2017

(65) Prior Publication Data
US 2019/0140007 A1 May 9, 2019

(30) Foreign Application Priority Data
Mar. 2, 2016 (JP) .................. 2016-040495

(51) Int. Cl.
*H01L 27/146* (2006.01)
*G01R 29/08* (2006.01)
(Continued)

(52) U.S. Cl.
CPC ........ *H01L 27/14625* (2013.01); *G01R 29/08* (2013.01); *G02B 5/3025* (2013.01);
(Continued)

(58) Field of Classification Search
CPC ................... H01L 27/14625; H01L 25/167
See application file for complete search history.

(56) References Cited

U.S. PATENT DOCUMENTS

| 5,850,255 A | 12/1998 | Falk |
| 6,906,506 B1 * | 6/2005 | Reano .................. G01R 1/071 324/754.06 |

(Continued)

FOREIGN PATENT DOCUMENTS

| JP | 2008-020304 A | 1/2008 |
| JP | 2011-043375 A | 3/2011 |

(Continued)

OTHER PUBLICATIONS

M. Tsuchiya et al., "Photonics Makes Microwaves Visible", Research Highlights, IEEE Photonics Society Newsletter, Dec. 2012, pp. 9-17, vol. 26, No. 6.

(Continued)

*Primary Examiner* — Thao P Le
(74) *Attorney, Agent, or Firm* — Sughrue Mion, PLLC (57) ABSTRACT

An electric field imaging device is provided with which it is possible to visualize as a dynamic state an electromagnetic field intensity distribution and a phase delay/advance distribution in the vicinity of a product, using a sample of the actual product without lead-out lines. The electric field imaging device includes: an antenna which accepts a high-frequency signal emitted by the sample as an input; an electrooptic (EO) crystal plate which is a frequency $f_{RF}$ high-frequency electric field sensor; a flashing light source which radiates polarized light onto the EO crystal plate; an optical system leading to an analyzer for detecting phase changes in polarized light obtained by means of the EO crystal plate; an image capturing device which converts an in-plane distribution of optical beam from the analyzer into (Continued)

an electrical signal; and an information processing device which processes and displays an output signal from the image capturing device.

7 Claims, 7 Drawing Sheets

(51) Int. Cl.
*G02B 5/30* (2006.01)
*G02F 1/00* (2006.01)
*H01L 25/16* (2006.01)
*H04N 5/225* (2006.01)

(52) U.S. Cl.
CPC .......... *G02F 1/0018* (2013.01); *H01L 25/167* (2013.01); *H04N 5/2256* (2013.01)

(56) References Cited

U.S. PATENT DOCUMENTS

| | | | | |
|---|---|---|---|---|
| 2009/0008531 A1* | 1/2009 | Caubet | ............... | H01L 27/14621 250/208.1 |
| 2010/0091292 A1* | 4/2010 | Pfaff | ................... | G01R 15/241 356/457 |
| 2010/0315541 A1* | 12/2010 | Egawa | .............. | H01L 27/14621 348/294 |

FOREIGN PATENT DOCUMENTS

| | | |
|---|---|---|
| JP | 2012-038805 A | 2/2012 |
| JP | 2012-053017 A | 3/2012 |
| JP | 2012-251786 A | 12/2012 |

OTHER PUBLICATIONS

Masahiro Tsuchiya et al., "Agile and compact near-field analyses of onboard Bluetooth module by live electrooptic imaging", Proceedings of the 46th European Microwave Conference, Oct. 4-6, 2016, pp. 1131-1134.

Masahiro Tsuchiya et al., "Asynchronous live electroopic imaging and its application to free-running broadband signal sources", IEICE Electronics Express, Mar. 16, 2016, pp. 1-10.

Masahiro Tsuchiya et al., "Live Electroopic Imaging of W-Band Waves", IEEE Transactions on Microwave Theory and Techniques, Nov. 2010, pp. 3011-3021, vol. 58, No. 11.

International Search Report for PCT/JP2017/004151 dated Apr. 11, 2017 [PCT/ISA/210].

Communication dated Oct. 23, 2019, from the Japanese Patent Office in application No. 2016-040495.

* cited by examiner

ELECTRIC FIELD IMAGING DEVICE

TECHNICAL FIELD

The present invention relates to an electric field imaging device that is capable of visualizing a two-dimensional distribution of a high-frequency oscillating electric field and its temporal and spatial variation in real time.

BACKGROUND ART

As a technique for visualizing a two-dimensional distribution of a high-frequency electric field in real time, the live electro-optic imaging technique, which has been invented by NICT (National Institute of Information and Communications Technology) (see NPL 1) is known. This is based on the electromagnetic field high speed imaging apparatus disclosed in PTL 1 and improvements that follow.

The live electrooptic imaging camera mentioned above is a device by which an electric field distribution in microwave bands up to 100 GHz is imaged and displayed in real time by using both super parallelism and high speed of light through an electrooptic effect.

If not restricted to "real-time" imaging, various types of techniques for imaging the distributions of electric fields have been proposed and implemented. So far, electric fields surrounding various circuits and devices have been imaged and used to analyze the circuits and devices, but spatial scanning has conventionally been a time-consuming process. Even under such a constraint, continuous efforts have been made to visualize electric fields and there have been high expectations for the development of "real-time" imaging.

Figure 1A:
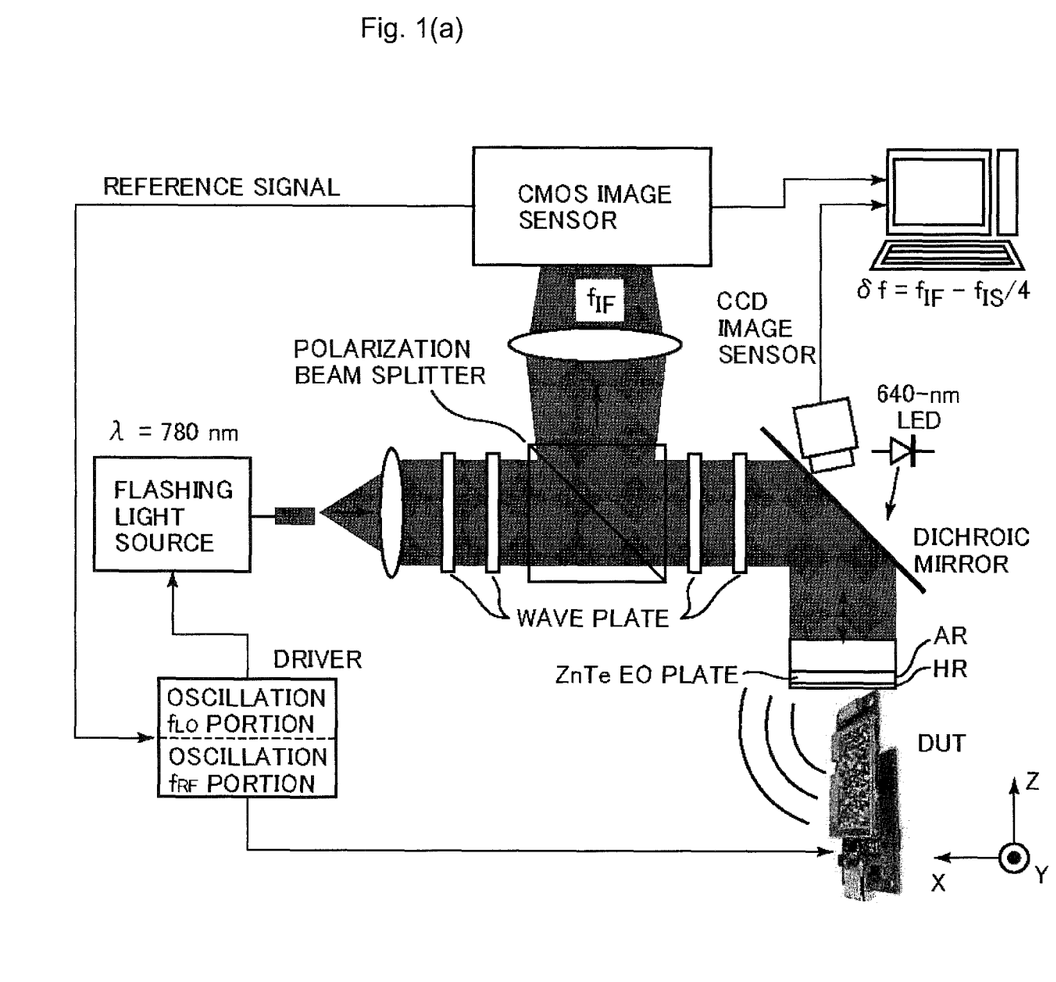
FIG. 1(a) is a block diagram of a conventional live electrooptic imaging camera.

FIG. 1(a) is a block diagram of the mentioned above and FIG. 1(b) illustrates a driver unit of the live electrooptic imaging camera. According to PTL 1, the driver unit includes an oscillation $f_{LO}$ portion for a flashing light source and an oscillation $f_{RF}$ portion for a sample. In the live electrooptic imaging camera, when the flashing light source irradiates an electro-optic (EO) crystal plate (probe in PLT1) with polarized light (illuminating light) which is amplitude-modulated at frequency $f_{LO}$, the electric field of a radio wave of frequency $f_{RF}$ emitted from the sample (DUT) changes the birefringence properties of the EO crystal state. This gives a change that reflects the change in birefringence at each position to the polarization state of the illuminating light. The polarized light with the polarization state changed as described above is selected by an optical system including an analyzer and the corresponding two-dimensional distribution is imaged by an image sensor. Thus, for detected light containing a difference frequency component (denoted by $\Delta f$ ($=|f_{LO}-f_{RF}|$) in PTL 1) between the modulation frequency ($f_{LO}$) of the illuminating light and the frequency ($f_{RF}$) of the electromagnetic field emitted from the sample, signals of respective pixels of the image sensor are obtained in parallel. The signals are sequentially output on a pixel-by-pixel basis, subjected to computation by an image processing device, and then displayed by an image display device.

In the electric field imaging technique using this live electrooptic imaging camera, a high-frequency electrical signal to be imaged is synchronized with the sampling by an internal high-speed CMOS image sensor (IS) of the imaging system. This is to avoid unstable display or disappearance of the result of simultaneous frequency conversion performed in the pixels of the image sensor.

Figure 1B:
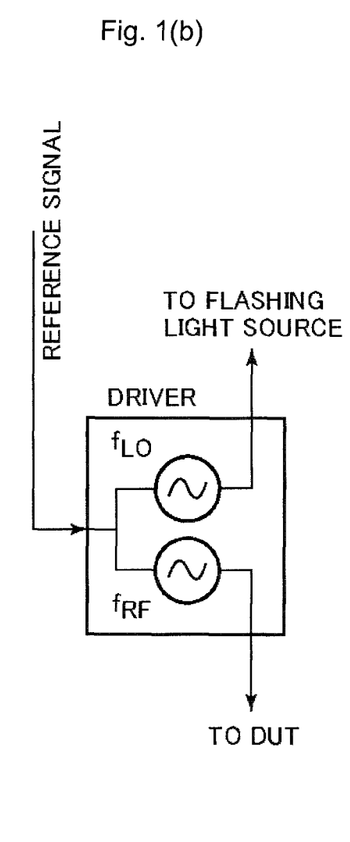
FIG. 1(b) is a diagram illustrating how a driver unit of the live electrooptic imaging camera is configured to generate signals for $f_{LO}$ and $f_{RF}$.

To achieve this synchronization, as illustrated in FIG. 1(b), signal sources capable of synchronizing with a reference signal from an external signal source have been used for signal sources for frequency $f_{LO}$ and frequency $f_{RF}$. Therefore, for the signal sources, the IS serves as a master and a DUT operation serves as a slave. This means that electric field imaging has been conventionally done by a system with a synchronization mode and a master mode.

That is, as illustrated in FIG. 1(b), the signal source for frequency $f_{LO}$ is also synchronized with an IS reference signal. This is because the difference frequency component $\Delta f$ between the signal for frequency $f_{LO}$ and the RF signal needs to be synchronized with the timing of IS sampling. The band of the difference frequency component $\Delta f$ is limited to a video frame rate (typically 10 Hz) or lower. To achieve this, if the instantaneous frequency of the RF signal is changed by modulation or data superimposition, the signal for frequency $f_{LO}$ needs to follow the RF signal so as to maintain the frequency difference $\Delta f$ between the signal for frequency $f_{LO}$ and the RF signal. This gives a limitation to both the DUT and the LO signal source.

As described above, electromagnetic waves that can be observed by the conventional live electrooptic imaging camera system have been very limited. For example, samples have been limited to those capable of synchronizing with an external signal source (primarily a synthesizer) or those capable of synchronizing with an IS clock. Generally, commercially available products or high-frequency modules used in the products require modification, such as addition of a circuit having a synchronization function or installation of additional wiring for signal input and output. There have rarely been products or modules that can serve as the above-described samples without being modified.

Signals used here are synchronized with a reference signal from the IS as described above. For the synchronization and the necessity to follow the RF signal described above, frequency synthesizers have conventionally been used as the signal sources for frequency $f_{LO}$ and frequency $f_{RF}$. In this case, however, their bandwidths are 1 Hz or less and the RF signal has a very narrow band. Generally, in the case of an actual module including a free-running signal source and a device using the module RF signal exhibits considerable changes and have wide bandwidths. Although the degree of changes differs from one high-frequency device to another, it is desirable that a bandwidth suitable for the sample be achievable.

CITATION LIST

Patent Literature

PTL 1: Japanese Unexamined Patent Application Publication No. 2008-20304

Non Patent Literature

NPL 1: M. Tsuchiya and T. Shiozawa, "Photonics makes microwaves visible," Research Highlights, IEEE Photonics Society Newsletter, Vol, 26, Number 6, December 2012, pp, 9-17.

SUMMARY OF INVENTION

Technical Problem

An object is to visualize an electromagnetic field intensity distribution and a phase lag/lead distribution and their dynamics in the vicinity of a sample by using, as the sample, an actual product or a prototype or module under development without modification, such as addition of lead-out lines or a circuit or block having a phase synchronization function.

Solution to Problem

In the present invention, an oscillating electric field in an oscillating electromagnetic field is observed using an electrooptic effect in an electrooptic (EO) crystal. The electrooptic effect is a phenomenon in which the phase state of polarized light propagating through the EO crystal changes. In the present invention, the phase changes through one reciprocation of the polarized light are detected and the electric field intensity is observed through one reciprocation of the polarized light. To detect such phase changes, the EO crystal is irradiated with polarized light. From the light transmitted through the EO crystal, phase-changed polarized light is selected by the analyzer. The selected light is then photoelectrically converted and detected.

An electric field imaging device according to the present invention is alive electrooptic imaging camera that observes an electric field distribution and its temporal variation in the vicinity of a sample that emits a high-frequency signal and a high-frequency electric field signal in a frequency band centered at frequency $f_{RF}$. The electric field imaging device includes a high-frequency signal input means for receiving a high-frequency signal emitted by the sample; an EO crystal plate serving as a sensor for sensing a high-frequency electric field; a flashing light source configured to irradiate the EO crystal plate with flashing polarized light; an optical system configured to guide the polarized light through the EO crystal plate to an analyzer that detects phase changes in polarized light; an image capturing means for converting an in-plane distribution of optical beam of the polarized light from the analyzer into an electrical signal; a signal processing means for detecting an output signal from the image capturing means and outputting an image frame signal frequency $f_P$; an information processing means for computing, displaying, transmitting, or storing the output from the signal processing means; and a flashing signal generating means for converting, by using a signal of a predetermined frequency independent of the sample, the high-frequency signal received by the high-frequency signal input means into a signal having $f_{LO}$ as a center frequency, and outputting the signal. The flashing light source flashes at frequency $f_{LO}$ in accordance with the output from the flashing signal generating means. Frequency $f_{IF}$ corresponding to a difference between frequency $f_P$ and frequency $f_{LO}$ is a frequency shifted by frequency $\delta f$, which is nonzero, from 1 or −1 times frequency $f_P$. By performing quadrature detection on each pixel of FIG. 5 output from the signal processing means using a signal having frequency $f_P$ as a reference carrier wave, position dependence of, and changes in, the amplitude or phase of the high-frequency electric field signal are displayed, transmitted, or stored.

The electric field imaging device further includes a delay compensation means for performing delay compensation for the high-frequency signal. The delay compensation means is placed in an electrical signal path for the high-frequency signal. The electrical signal path runs from the high-frequency signal input means to the signal processing means.

The information processing means generates an image signal for a display image for the display device by using a value obtained by multiplying a phase signal separated from an image signal by a predetermined nonzero value. This can emphasize, for example, the position dependence of, and changes in, the phase.

The flashing signal generating means
(1) mixes a signal of predetermined frequency $f_{LO1}$ with a signal of frequency $f_{RF}$ received from the high-frequency signal input means to generate a signal of frequency ($f_{IF2}=f_{RF}-f_{LO1}$) on a difference frequency side ($f_{RF}-f_{LO1}$); and
(2) mixes the signal generated in (1) with a signal of frequency $f_{LO2}$ (=$f_{LO1}-f_{IF}$) differing by a predetermined frequency difference ($f_{IF}$ allowed to be either positive or negative) from the signal of frequency $f_{LO1}$ to generate a signal of frequency ($f_{LO}=f_{RF}-f_{IF}$) on a sum frequency side ($f_{IF2}+f_{LO2}$) and thereby generate a signal of frequency ($f_{LO}$) very close to frequency $f_{RF}$.

The flashing signal generating means may
(1) mix a signal of predetermined frequency $f_{LO1}$ with a signal of frequency $f_{RF}$ received from the high-frequency signal input means to generate a signal of frequency ($f_{IF2}=f_{RF}+f_{LO1}$) on a sum frequency side ($f_{RF}+f_{LO1}$); and
(2) mix the signal generated in (1) with a signal of frequency $f_{LO2}$ (=$f_{LO1}-f_{IF}$) differing by a predetermined frequency difference ($f_{IF}$ allowed to be either positive or negative) from the signal of frequency $f_{LO1}$ to generate a signal of frequency ($f_{LO}=f_{RF}+f_{IF}$) on a difference frequency side ($f_{IF2}-f_{LO2}$) and thereby generate a signal of frequency ($f_{LO}$) very close to frequency $f_{RF}$.

It is desirable that one or more signals of the predetermined frequency independent of the sample be used by the flashing signal generating means, and that the one or more signals be each generated by using a reference signal based on a clock that controls an imaging frame rate of the image capturing means.

An oscillating magnetic field in an oscillating electromagnetic field may be observed using a magneto-optical effect in a magneto-optics (MO) crystal. The magneto-optical effect is a phenomenon in which the polarization state of polarized light transmitted through or reflected from the MO crystal is modulated. The magnetic field intensity is measured by detecting the modulation of the. The modulation of the polarization state is detected by irradiating the MO crystal with the polarized light, selecting the polarized light having the modulated polarization state from the resulting transmitted or reflected light using an analyzer, and photoelectrically converting the selected polarized light.

Advantageous Effects of Invention

Without modification, such as addition of wiring for leading a high-frequency signal (reference signal) or addition of a synchronous circuit block for the leading, to a high-frequency signal device, the electromagnetic field of the high-frequency signal device can be visualized and the dynamics of phase changes can be displayed as a moving image. This makes it possible to visually inspect the operation of a high-frequency circuit and carry out failure diagnosis.

BRIEF DESCRIPTION OF DRAWINGS

FIGS. 3(a) and 3(b) are supplementary block diagrams for explaining principles of the present invention.

FIGS. 4(a) and 4(b) are block diagrams each illustrating an exemplary device configuration based on operating principles equivalent to those of the present invention.

FIG. 7 illustrates a result of applying the present invention to a 2.4 GHz radio wave emitted from a chip antenna mounted on an on-board Bluetooth (registered trademark) module; FIG. 7(d) shows a measured electric-field intensity distribution in the vicinity of the chip antenna, which is superimposed on an optical image.

DESCRIPTION OF EMBODIMENTS

Figure 2:
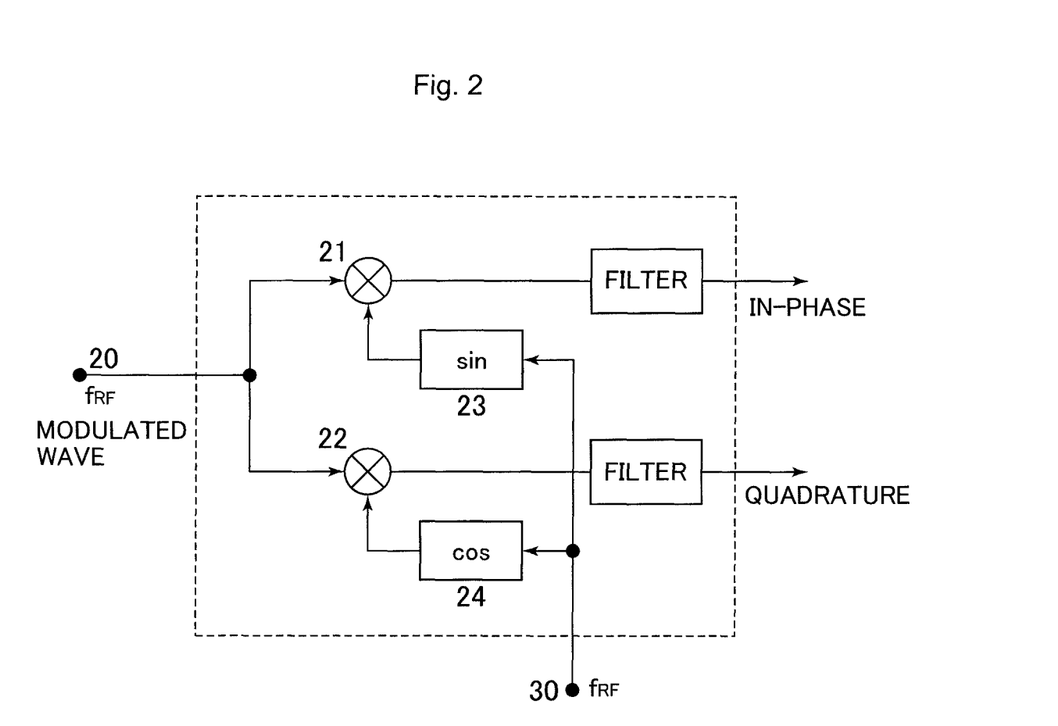
FIG. 2 is a block diagram of a typical quadrature detector circuit.
Figure 3A:
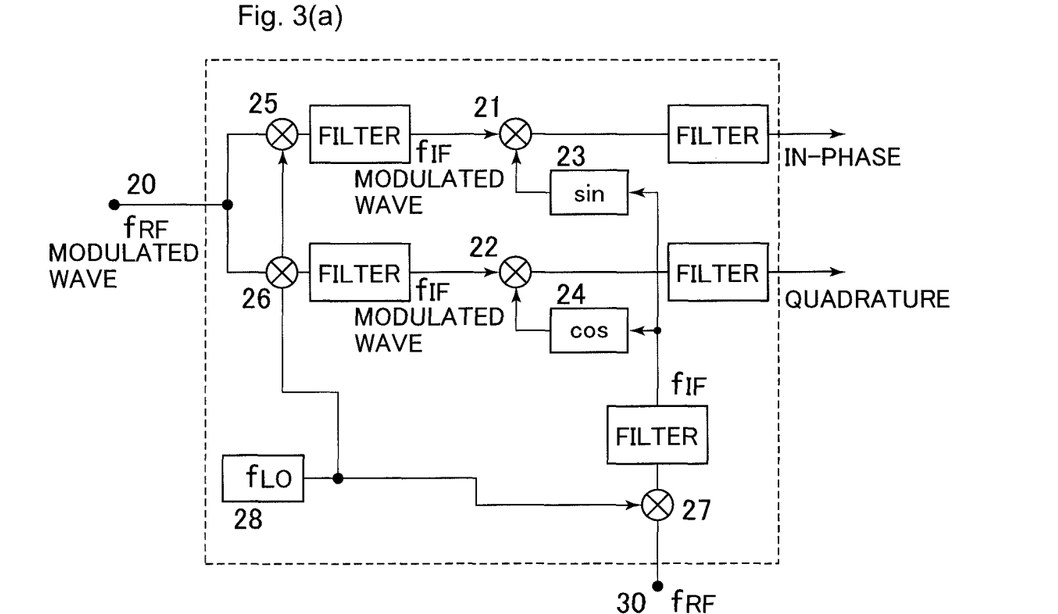
FIG. 3(a) is a block diagram of a circuit that performs frequency conversion of an input modulated wave and a reference carrier wave in quadrature detection in FIG. 2.
Figure 3B:
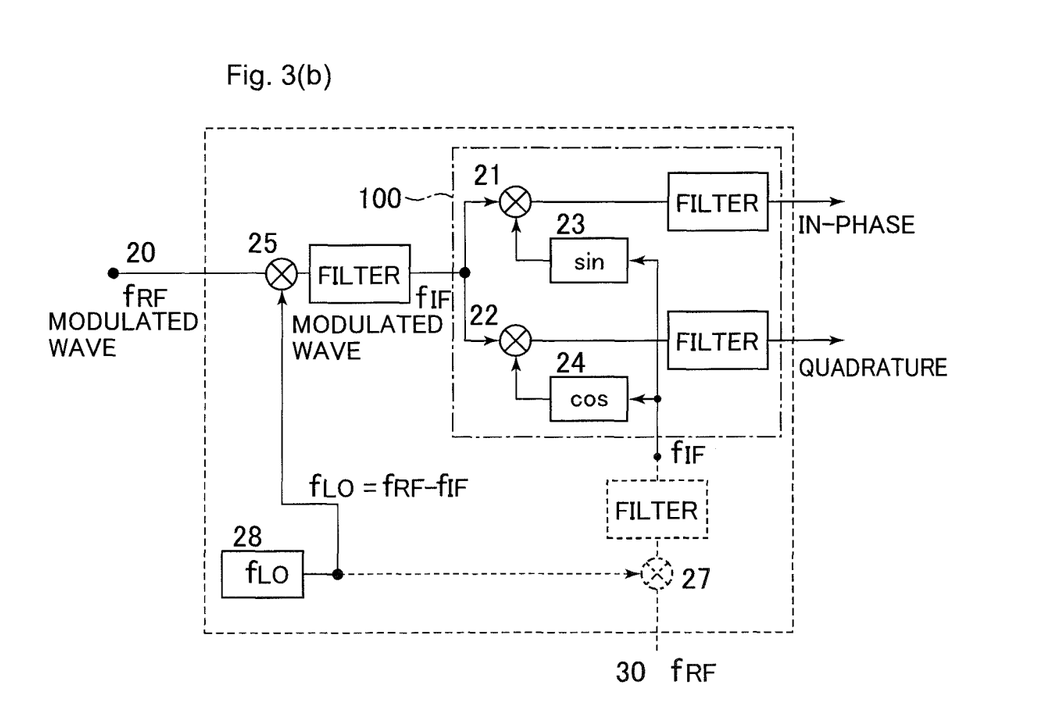
FIG. 3(b) illustrates a configuration in which, in the block diagram of FIG. 3(a), a mixing unit (indicated by a broken line) for the reference carrier wave is simplified by sharing a mixing circuit for the input modulated wave and setting a frequency for the frequency conversion to "$f_{LO}=f_{RF}-f_{IF}$".

The principles of the present invention are illustrated in FIGS. 2, 3(a) and 3(b).

FIG. 2 is a block diagram often used to explain quadrature detection. In this block diagram, an input modulated wave 20 of frequency $f_{RF}$ is quadrature-detected by using a reference carrier wave 30 of frequency $f_{RF}$. The input signal is divided into two, one of which is mixed with a sine wave of the reference carrier wave 30 by a mixer 21, subjected to filtering which removes low-frequency components, and output as an in-phase (I) component, and the other of which is mixed with a cosine wave of the reference carrier wave 30 by the mixer 21, subjected to filtering which removes low-frequency components, and output as a quadrature (Q) component. From the in-phase and quadrature components, the amplitude and phase of the input modulated wave can be easily obtained.

Even when the configuration of FIG. 2 is changed to that in FIG. 3(a) in such a manner that the modulated wave 20 of frequency $f_{RF}$ and the reference carrier wave 30 of frequency $f_{RF}$ are frequency-converted using waves into which the output from a common local oscillator 28 is divided, since the effect of the frequency conversion is cancelled out by the mixer 21 or 22, it is obvious that the quadrature detection function remains unchanged and the amplitude and phase of the modulated wave of frequency $f_{RF}$ can be obtained easily.

A mixer 25 and the subsequent filter that perform frequency conversion of the modulated wave 20 of frequency $f_{RF}$, as in FIG. 3(a), can be shared between the in-phase channel and the quadrature channel. Therefore, it is obvious that the function remains unchanged even when, as in FIG. 3(b), the output of a mixer 29 and the subsequent filter is divided and used.

It is obvious that by performing the frequency conversion in the manner described above, even when a frequency region applicable to a quadrature detector 100 is relatively low, the configuration can be made applicable to a frequency region higher than that of the quadrature detector 100.

In the block diagram of FIG. 3(a), the reference carrier wave 30 of frequency $f_{RF}$ is mixed with the output of the local oscillator 28 and frequency-converted to frequency $f_{IF}$. When, as illustrated in FIG. 3(b), output frequency $f_{LO}$ of the local oscillator 28 is $f_{LO}=f_{RF}-f_{IF}$, the mixer 27 and the subsequent filter convert it to frequency $f_{IF}$. Therefore, by originally setting the frequency of the reference carrier wave for the quadrature detector 100 to $f_{IF}$, the frequency conversion by the mixer 27 can be skipped.

Figure 4A:
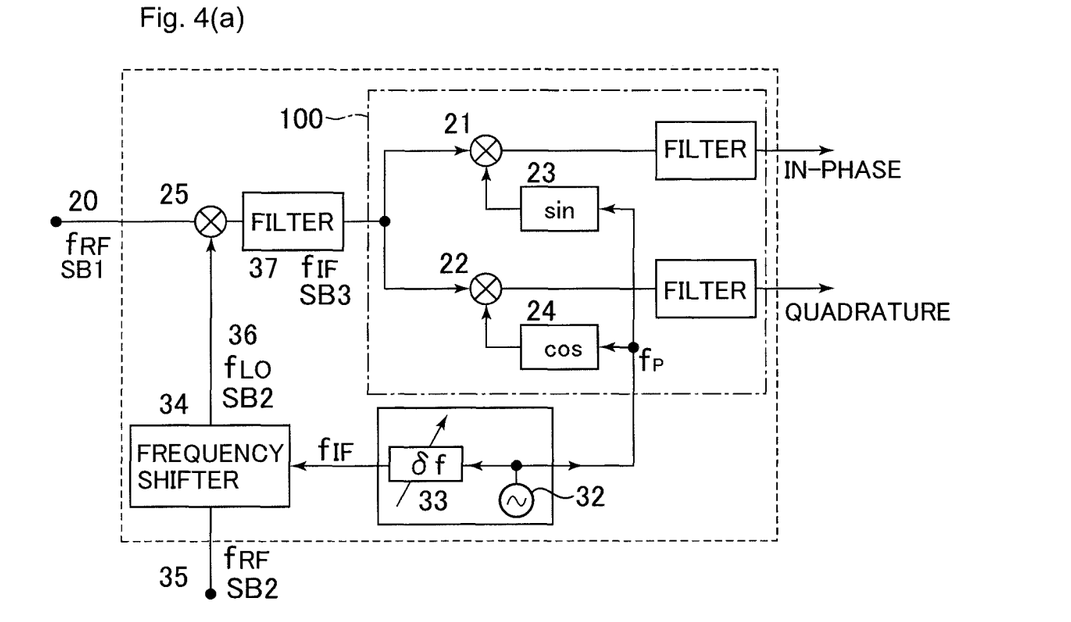
FIG. 4(a) is a block diagram illustrating a configuration in which, under frequency conditions for the frequency conversion in FIG. 3(b), an input modulated wave is frequency-converted using a signal obtained by shifting the frequency of a signal received from the outside and a reference carrier wave is shifted by δf.
Figure 4B:
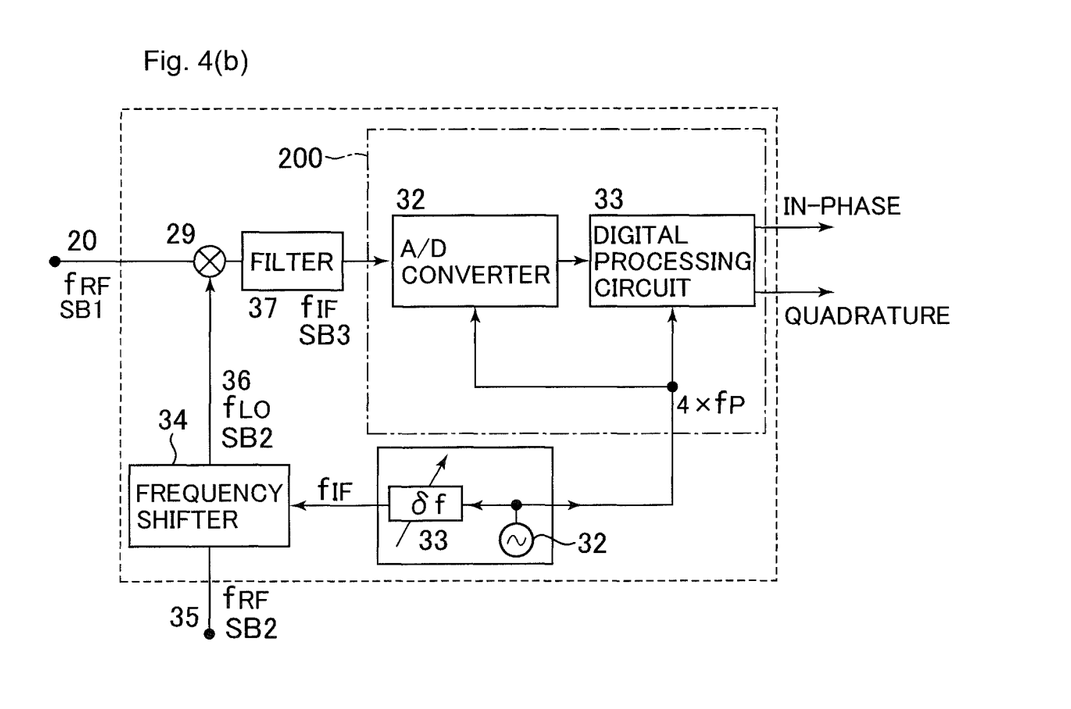
FIG. 4(b) is a block diagram illustrating an example in which quadrature detection in the configuration of FIG. 4(a) is performed by digital signal processing.

FIGS. 4(a) and 4(b) are block diagrams illustrating configurations that are closer to the embodiment of the present invention than the configurations of FIG. 3 are. In FIGS. 4(a) and 4(b), the modulated wave 20 of frequency $f_{RF}$ having a sideband wave SB1 corresponds to an input modulated wave, and a modulated wave 35 of frequency $f_{RF}$ having a sideband wave SB2 corresponds to a reference carrier wave in FIGS. 3 (a) and (b). The modulated frequency 35 corresponds to a reference carrier wave acquired at a fixed position. A primary difference between the modulated wave 20 of frequency $f_{RF}$ and the modulated wave 35 of frequency $f_{RF}$ is a phase. A frequency shifter 34 shifts the frequency alone to produce a modulated wave 36 of frequency $f_{LO}$ having the sideband wave SB2. The modulated wave 20 and the modulated wave 37 are mixed by the mixer 25, filtered by the subsequent filter, and converted to a modulated wave 37 of frequency $f_{IF}$ having a sideband wave SB3. The frequency conversion of the modulated wave 20 of frequency $f_{RF}$ from the sample is performed not by using the output of the local oscillator 28, but is performed by the mixer 25 using a signal of frequency $f_{LO}$ obtained by frequency-converting a predetermined signal of frequency $f_{RF}$ received from the sample. A frequency difference ($|f_{RF}-f_{LO}|$) between these signals is compensated for by a signal of frequency $f_{IF}$ from a signal generator 33. The signal generator 33 generates a signal of frequency $f_{IF}$ which is shifted by δf from frequency $f_P$ from a signal generator 32. A signal of frequency $f_P$ from the signal generator 32 is applied as a reference carrier wave to the quadrature detector 100. Therefore, in the quadrature detector 100, where the frequency of the input modulated wave is $f_{IF}$, frequency $f_P$ of the reference carrier wave is shifted by δf from $f_{IF}$.

The reason for intentionally shifting the above frequency by frequency δf is to obtain a phase produced by quadrature detection as a linear function of time having δf as a coefficient.

The frequency δf is entered, or selected from multiple candidates, by a user of the electric field imaging device.

The shift δf allows the phase of the modulated wave 20 of frequency $f_{RF}$ to be dynamically changed and easily viewed. For example, phase values obtained by quadrature detection may be directly displayed, or may be displayed as a gray-scale (monochrome) pattern of wavelength intervals by using a MOD function or calculating the sine of the phase values. In this case, changes in the phase of the input modulated wave 20 can be perceived as changes in the displayed gray-scale (monochrome) pattern. When a MOD function is used or the sine of the phase values is calculated, the changes in the phase of the input modulated wave 20 can be represented by the number of stripes, as in the case of contour lines.

The block diagram of FIG. 4(b) illustrates an exemplary configuration in which a quadrature detector 200 is configured as a digital circuit. In this exemplary configuration, as in the case of FIG. 4(a), the modulated wave 20 of frequency $f_{RF}$ having the sideband wave SB1 corresponds to an input modulated wave having position dependence, and the modulated wave 35 of frequency $f_{RF}$ having the sideband wave SB2 corresponds to a reference carrier wave acquired at a fixed position. A primary difference between the modulated wave 20 of frequency $f_{RF}$ and the modulated wave 35 of frequency $f_{RF}$ is a phase. The frequency shifter 34 shifts the frequency alone to produce the modulated wave 36 of frequency $f_{LO}$ having the sideband wave SB2. The modulated wave 20 and the modulated wave 37 are mixed by the mixer 25, filtered by the subsequent filter, converted to the modulated wave 37 of frequency $f_{IF}$ having the sideband wave SB3, and received by the quadrature detector 200 as an input modulated wave. The frequency shifter 34 shifts the frequency by $f_{IF}$, which is the frequency of a signal from the signal generator 32. The frequency $f_{IF}$ is a frequency shifted by frequency δf from M (1 or −1) times the frequency $f_P$ of a reference carrier wave, i.e., a signal from the signal generator 32, for the quadrature detector 200.

Processing in the digital circuit is performed, for example, in accordance with a well-known, quad-frequency sampling technique. The frequency of quantization in the A/D converter 32 is four times the frequency $f_P$ described above, and frequency $f_P$ is the frequency of a signal of image frames obtained by computing imaging frames. Since display on a computer 5 is carried out at a display frame rate, image frame data is converted, as necessary, to display frame data after signal processing. The frame rate may be converted at the same time.

First Embodiment

Hereinafter, embodiments of the present invention will be described in detail on the basis of the drawings. In the following description, devices with the same or similar functions are denoted by the same reference numerals unless there is some reason.

Figure 5:
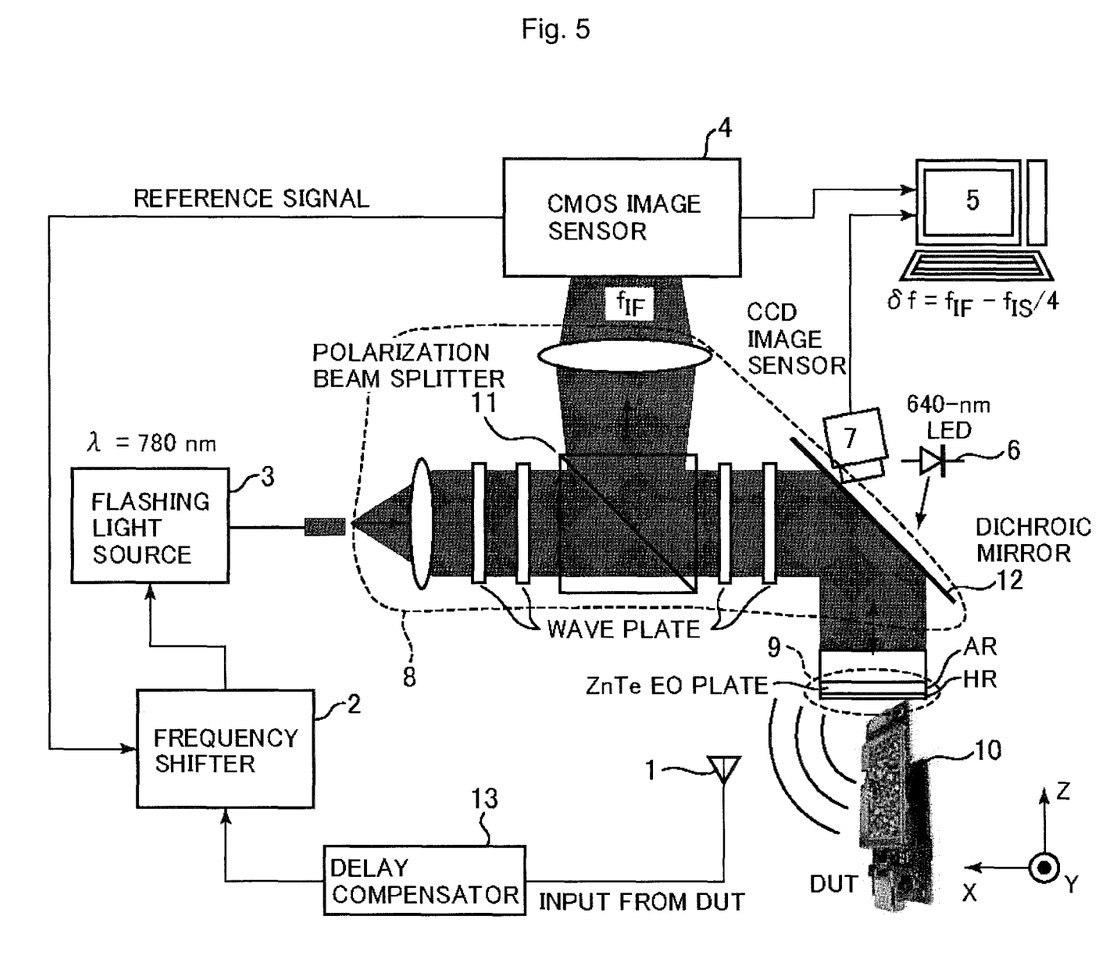
FIG. 5 is a block diagram illustrating a device configuration according to the present invention.

FIG. 5 is a block diagram illustrating an electric field imaging device according to the present invention. In the configuration illustrated in FIG. 5, the birefringence of an electrooptic crystal plate (EO crystal, such as ZnTe crystal) of an electric field sensor unit 9 is changed by a high-frequency electric field in the vicinity of a sample (DUT) 10. This change in birefringence modulates polarized light originating from a flashing light source 3 and having a wavelength of 780 nm, passing through an optical system 8, and entering the electric field sensor unit 9. A surface of the electric field sensor unit 9 adjacent to the sample is coated with a high-reflectivity (HR) coating. Immediately after being transmitted through the electrooptic crystal plate, the polarized light applied to the high-reflectivity coating is reflected, transmitted through the electrooptic crystal plate again, and polarization-modulated. The polarized light is then reflected by a dichroic mirror 12 and enters a polarization beam splitter 11. The polarization beam splitter 11 is positioned in such a manner that although it exhibits high transmittance for polarized light from the flashing light source 3, it increases its reflectance for polarized light inclined with respect to the polarized light from the flashing light source 3, in accordance with the angle of inclination. Therefore, a polarized component whose plarization state has been modulated by the electrooptic crystal plate is reflected by the plarization beam splitter 11 and enters a CMOS image capturing device 4. An image obtained by the image capturing device 4 is subjected to image processing and computation required for digital quadrature detection in the computer 5, also subjected to statistical processing such as, averaging, etc. and conversion to a display frame rate as necessary, and then displayed by the computer 5. An optical image of the sample 10 is obtained by a CCD image capturing device 7 under illumination of 640 nm light from an LED 6 via the dichroic mirror 12, superimposed on the image obtained by the image capturing device 4, and displayed by the computer 5. The high-reflectivity (HR) coating described above has a characteristic of transmitting light from the LED 6. The wavelength of polarization light emitted from the flashing light source should be fully separated, by the dichroic mirror, from the wavelength of illuminating light from the LED 6. Light from the LED 6 should have a position and a plarization property that do not allow the polarization beam splitter to easily reflect the light toward the image capturing device 4.

The configuration illustrated in the block diagram of FIG. 5 follows the concept illustrated in FIG. 4(b). The phase of an input modulated wave has position dependence by entering the electric field sensor unit 9. A frequency-shifted signal corresponding to the modulated wave 35 illustrated in FIG. 4 enters an antenna 1. The frequency-shifted signal is a radio wave received from the sample 10. Since the relative position between the antenna and the EO crystal plate is fixed, a base phase for an input modulated wave for each pixel is established. The frequency-shifted signal is shifted by frequency $f_{IF}$ by a frequency shifter 2. The frequency $f_{IF}$ is a signal generated on the basis of a signal generated from an internal clock of the CMOS image capturing device 4, such as a signal obtained by shifting, by δf, the frequency of a signal that is synchronized with image frame generation timing. The output of the frequency shifter 2 obtained by shifting by frequency $f_{IF}$ is superimposed on an optical beam from the flashing light source, mixed with the input modulated wave in the electric field sensor unit 9 to generate an optical beam on which a signal of frequency $f_{IF}$ is superimposed, and imaged by the CMOS image capturing device 4. The CMOS image capturing device 4 performs processing using the quadruple-frequency sampling technique and outputs a signal of image frames at frequency $f_P$.

Although various types of devices can be used as the image capturing device 4, a CMOS image capturing device is used in this example. Although a CCD image capturing device may be used, a CMOS image capturing device is more suitable for use in imaging at a high frame rate because of its good noise characteristics.

A flashing signal from the flashing light source 3 may be generated in the frequency shifter 2 by combining a signal based on a clock that controls the CMOS image capturing device 7 with a signal emitted from the sample 10 and picked up by the antenna 1. Examples of the frequency shifter 2 include an image reject mixer and a single-sideband mixer.

A signal from the antenna 1 passes through a delay compensator 13 and enters the frequency shifter 2. The delay compensator is for compensating for a time lag, in the electric field sensor unit 9, between a high-frequency electric field signal directly coming from the sample 10 and a high-frequency signal received through the antenna 1. The delay compensator 13 is placed in an electrical signal path for the high-frequency signal, running from the antenna 1 to the computer 5.

Figure 6A:
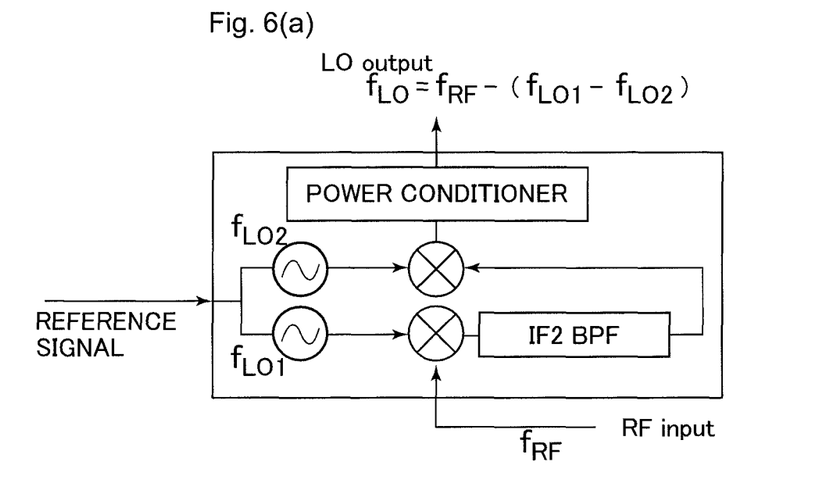
FIG. 6 is a block diagram illustrating how a frequency shifter 2 of the present invention is configured to generate a signal of frequency $f_{LO}$ for a flashing light source, from a signal from a sample and a reference signal.
Figure 6B:
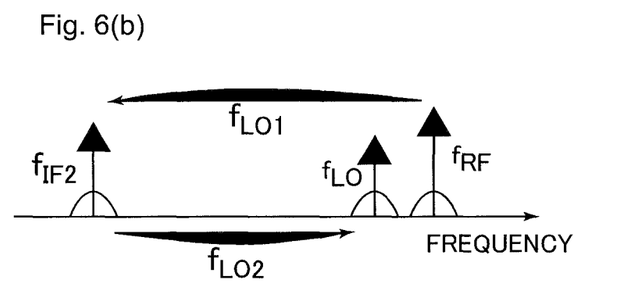
FIG. 6(b) illustrates processes which involves temporarily converting, to an intermediate signal of frequency $f_{IF2}$, a signal of frequency $f_{RF}$ from the sample with no modification or addition of a circuit thereto and no addition of lead-out lines thereto, and converting the intermediate signal to a signal of frequency $f_{LO}$ to achieve frequency $f_{LO}$ very close to frequency $f_{IF}$.
Figure 6C:
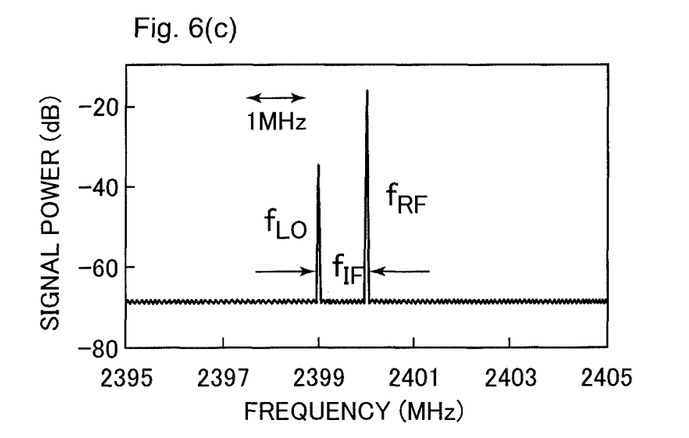
FIG. 6(c) is a spectrum diagram illustrating a practical application relating to generation of a signal of flashing frequency $f_{LO}$ according to the present invention.

A signal for the flashing light source 3 may be generated by combining as illustrated in FIG. 6. As illustrated in FIG. 6(b), the above signal generation involves mixing a signal of frequency $f_{RF}$ from the antenna 1 with a signal of frequency $f_{LO1}$ for temporary conversion to an intermediate signal of frequency $f_{IF2}$, and converting the intermediate signal using a signal of frequency $f_{LO2}$ to achieve frequency $f_{LO}$ very close to frequency $f_{RF}$. This procedure is detailed below.

Second Embodiment

In the following procedure, frequency conversion is performed in two stages to generate a signal of a frequency very close to the original frequency.

1-1: First, a high-frequency signal from the sample (DUT) 10 is received through the antenna 1. The high-frequency signal received is used as a frequency-shifted signal and corresponds to the modulated wave 35 of frequency $f_{RF}$. This high-frequency signal is used by the frequency shifter 2 illustrated in FIG. 5 to generate a signal of frequency $f_{LO}$. An independent EO crystal may be provided to receive and use an electric field signal of specific part. The electric field sensor unit 9 may be continuously read out at a specific position to obtain the modulated wave 35 of frequency $f_{RF}$ used as a frequency-shifted signal for generating a signal of frequency $f_{LO}$ in the same manner as above. Although the reception is carried out through the antenna 1 in FIG. 5, if the sample 10 has lead-out lines, the reception may be carried out using the lead-out lines. However, it is desirable to receive the modulated wave 35 of frequency $f_{RF}$ used as the reference carrier wave without contacting the sample.

1-2: Next, a predetermined base signal of frequency $f_{LO1}$ (e.g., a sine wave of $f_{LO1}$ of about 2 GHz with respect to $f_{RF}$ of 2.4 GHz) is mixed with a signal of frequency $f_{RF}$ by a mixer, and a signal of a frequency ($f_{IF2}=f_{RF}-f_{LO1}$) on a difference frequency side is selected by a filter (IF2BPF). This first base signal of frequency $f_{LO1}$ is a base signal generated using a reference signal based on the clock that controls the frame rate of the image capturing device 7. The frequency of the first base signal is a frequency that is high enough for the filter to fully suppress signals of frequency $f_{RF}$ and higher, and needs to be determined depending on the performance of the filter.

1-3: Next, the first base signal is mixed with a second base signal of frequency $f_{LO2}$ that differs by predetermined frequency difference $L_{IF}$ from the first base signal, and a signal of a frequency ($f_{LO}=f_{IF2}+f_{LO2}$) on a sum frequency side is selected by a filter (not shown). Note that frequency $f_{LO2}$ is either $f_{LO2}=f_{LO1}-f_{IF}$ or $f_{LO0072}=f_{LO1}+f_{IF}$. The second base signal of frequency $f_{LO2}$ is also a base signal generated using a reference signal based on the clock that controls the image capturing device 7.

When a signal of frequency $f_{LO}$ is generated as described above, generating the first base signal and the second base signal using a reference signal based on the clock that controls the image capturing device 4 contributes to stabilize quadrature detection by mixing at an imaging frame rate in the image capturing device 4. That is, an optical beam that enters the CMOS image capturing device 4 is an optical beam of frequency $f_{IF}$ obtained by frequency conversion of frequency $f_{LO}$ ($=f_{RF}-f_{IF}$). Even if frequency $f_{IF}$ contains an unstable part, since a signal having frequency $f_P$ signal of frequency $f_{IF}$ ($=f_P+\delta f$) is generated from the clock in the image capturing device 4, the unstable part is cancelled out and this ensures stable quadrature detection.

When frequency $f_{IF}$ is allowed to be a negative frequency in the frequency conversion performed in two stages, the values of $f_{LO2}$ and $f_{LO1}$ are also effective values that are practically applicable.

The frame rates assumed in the present invention include an imaging frame rate used when the image capturing device performs imaging, an image frame rate at which data from the image capturing device is processed and output as an image, and a display frame rate at which the image with the image frame rate is converted or processed into an image for a display device. More specifically, the image frame rate is a frame rate acquired as an image. For example, the frequency of a signal of image frame rate is $f_P=f_{IS}/4$ when quadruple-frequency sampling is performed as in the case of FIG. 4(b), whereas the frequency of a signal of the image frame rate is $f_P=f_{IS}$ when an analog circuit is used as illustrated in FIG. 4(a), where $f_{IF}$ is the frame rate of the image capturing device.

Also, $f_{IF}$ is a value obtained by adding or subtracting a frequency $f_P$ of a signal of the image frame rate $f_P$ obtained by the image capturing device to or from $\delta f$. That is, $f_{IF}$ is expressed as $f_{IF}=M\times f_P+\delta f$, where M is 1 or −1 as described above. It is desirable that frequency f be a value set, or selected from a plurality of values, by the user of the electric field imaging device of the present invention.

When M=0, the phase information of the input modulated wave can be obtained by photoelectrically converting the optical beam entering the CMOS image capturing device 4, using a photodiode or the like placed as a substitute for the CMOS image capturing device 4.

1-4: Next, the signal of frequency $f_{LO}$ generated as described above is amplified, through a two-stage filter (not shown), by a power conditioner illustrated in FIG. 6(a) and fed to the flashing light source 3.

Generally, it is well known that filters can be used as substitutes for circuits using the frequency characteristics of the circuits. The same is true in the present invention.

The computer 5 serving as an information processing means includes an image processing unit, a computing unit, a control unit, and a display unit, which perform their respective functions. The image processing unit receives an image signal from the CMOS image capturing device 4 and performs quadrature detection on each pixel. The quadrature detection may be made by digital processing using a quadruple-frequency sampling technique. The computing unit detects amplitude and phase components separately. By the control unit and the display unit, an image representing information of each pixel of the amplitude and phase components is stored in the computer 5, transmitted, or displayed in the display unit.

Third Embodiment

The steps (1-2) and (1-3) described above may be replaced by the following.

2-2: A predetermined base signal of frequency $f_{LO1}$ (e.g., a sine wave of $f_{LO1}$ of about 2 GHz with respect to $f_{RF}$ of 2.4 GHz) is mixed with a signal of frequency $f_{RF}$ by a mixer, and a signal of a frequency ($f_{IF2}=f_{RF}+f_{LO1}$) on a sum frequency side is selected by the filter (IF2BPF). The filter in this case is capable of fully suppressing signals of frequency $f_{RF}$ and lower.

2-3: Next, the first base signal is mixed with a second base signal of frequency $f_{LO2}$ that differs by predetermined frequency difference $L_{IF}$ from the first base signal, and a signal of a frequency ($f_{LO}=f_{IF2}-f_{LO2}$) on a difference frequency side is selected by a filter (not shown). Note that frequency $f_{LO2}$ is either $f_{LO2}=f_{LO1}-f_{IF}$ or $f_{LO2}=f_{LO1}+f_{IF}$. The second base signal of frequency $f_{LO2}$ is also a base signal generated using a reference signal based on the dock that controls the image capturing device 7.

Again, when frequency $L_{IF}$ is allowed to be a negative frequency in the frequency conversion performed in two stages in the present embodiment, the values of $f_{LO2}$ and $f_{LO1}$ are also effective values that are practically applicable.

Fourth Embodiment

Figure 7A:
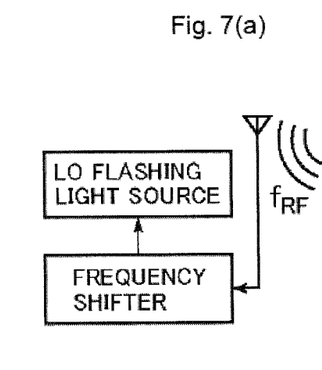
FIG. 7(a) illustrates a configuration in which a high-frequency signal from a sample is frequency-converted and applied to a flashing light source.
Figure 7B:
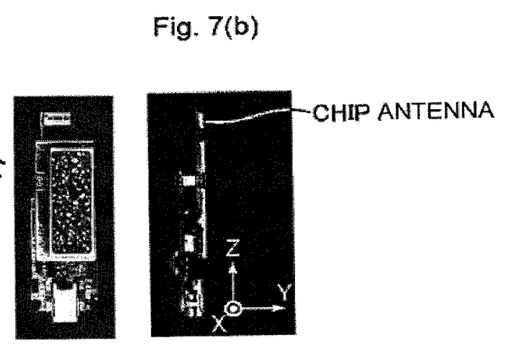
FIG. 7(b) is a side view of the module.
Figure 7C:
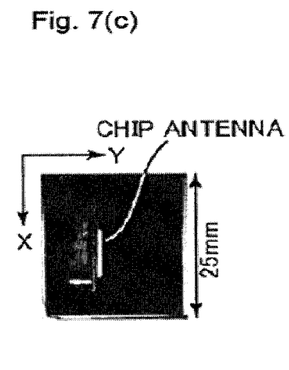
FIG. 7(c) shows a result of optically imaging a bird's-eye view of the sample through an EO crystal plate, as seen along the z-axis.
Figure 7D:
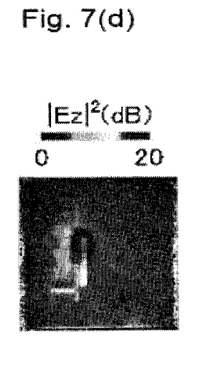
FIG. 7(d) shows a measured electric-field intensity distribution in the vicinity of the chip antenna, the electric-field intensity distribution being superimposed on an optical image.
Figure 7E:
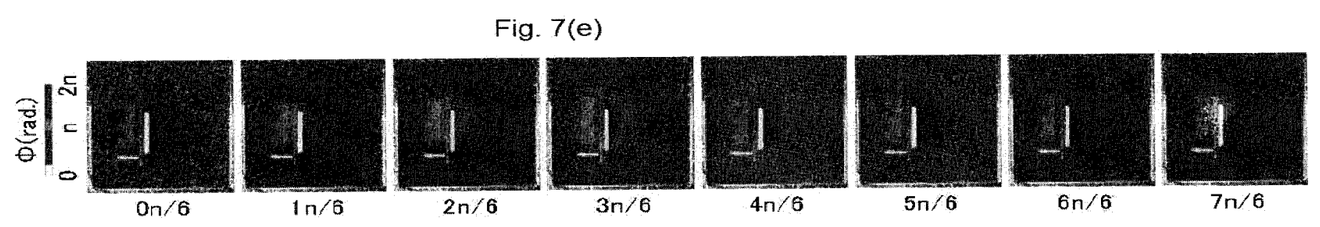
FIG. 7(e) shows a series of stroboscopic images representing wavefront progression and superimposed on optical images.
Figure 7F:
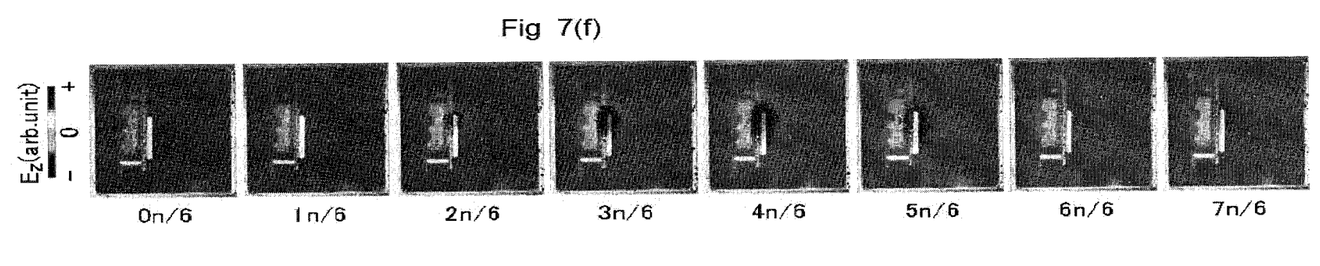
FIG. 7(f) shows a series of stroboscopic images representing progression of an electric field phasor.

Conventionally, it has been difficult to perform instantaneous electric field imaging of products having a signal source mounted thereon and also of modules included in such products. The present invention makes this possible. FIG. 7 illustrates a result of applying the present invention to a 2.4 GHz radio wave emitted from a chip antenna mounted on an on-board Bluetooth (registered trademark) module. This commercially available module includes therein a quartz-crysta-oscillator-based, free-running signal source, but has no synchronizing signal input/output terminal or RF signal output terminal. FIG. 7(a) illustrates a configuration in which a high-frequency signal from a sample is received, directly frequency-converted, and applied to a flashing light source. FIG. 7(b) is a side view of the module. FIG. 7(c) shows a bird's-eye view of the sample as seen along the z-axis, that is, an optical image obtained through an EO crystal plate. FIG. 7(d) shows a measured electric-field intensity distribution in the vicinity of the chip antenna. The electric-field intensity distribution, which is superimposed on the optical image, reflects chip antenna characteristics and influences radio emission of an on-board module substrate and a USB interface substrate. FIG. 7(e) shows a series of stroboscopic images representing wave-front progression and superimposed on optical images. Eight shots taken every π/6 are shown in FIG. 7(e). FIG. 7(f) shows a series of stroboscopic images representing progression of an electric field phasor. Eight shots taken every π/6 are shown in FIG. 7(f). FIG. 7(g) shows a wave vector distribution using visualized complex two-dimensional Fourier transform. It is thus apparent that with the present invention, the progression of phases in a high-frequency device can be viewed as an image.

INDUSTRIAL APPLICABILITY

The description above shows that with the present invention, the progression of phases in a high-frequency device can be viewed as an image. It can therefore be expected that the time required for operation of modules and products, failure analysis and diagnosis, and EMC measures will be significantly reduced, and enhanced competitiveness will be achieved in terms of cost and performance.

REFERENCE SIGNS LIST

1: antenna
2: frequency shifter
3: flashing light source
4: image capturing device
5: computer
6: LED
7: image capturing device
8: optical system
9: electric field sensor unit
10: sample
11: polarization beam splitter
12: dichroic mirror
13: delay compensator
20: modulated wave
21, 22: mixer
23: sine wave generator
24: cosine wave generator
25, 26, 27: mixer
28: local oscillator
29: mixer
30: reference carrier wave
31: frequency converter
32, 33: signal generator
34: frequency shifter
35: modulated wave of frequency $f_{RF}$
36: modulated wave of frequency $f_{LO}$
37: modulated wave of frequency $f_{IF}$

The invention claimed is:

1. An electric field imaging device that is an live electrooptic imaging camera configured to observe an electric field distribution and temporal variation thereof in a vicinity of a sample that emits a high-frequency signal and a high-frequency electric field signal in a frequency band centered at frequency $f_{RF}$, the electric field imaging device comprising:

a high-frequency signal input unit configured to receive a high-frequency signal emitted by the sample;

an electrooptic crystal plate serving as a sensor for sensing a high-frequency electric field;

a flashing light source configured to irradiate the electrooptic crystal plate with flashing polarized light;

an optical system configured to guide the polarized light through the electrooptic crystal plate to an analyzer that detects phase changes in polarized light;

an image capturing unit configured to convert an in-plane distribution of optical beam of the polarized light from the analyzer into an electrical signal;

a signal processing unit configured to detect an output signal from the image capturing unit and output an image frame signal at frequency $f_F$;

an information processing unit configured to compute, display, transmit, or store the output from the signal processing unit; and a flashing signal generating unit configured to convert, by using a signal of a predetermined frequency independent of the sample, the high-frequency signal received by the high-frequency signal input unit into a signal having $f_{LO}$ as a center frequency and output the signal, wherein the flashing light source flashes at frequency $f_{LO}$ in accordance with the output from the flashing signal generating unit;

frequency $f_{IF}$ corresponding to a difference between frequency $f_{RF}$ and frequency $f_{LO}$ is a frequency shifted by frequency of, which is nonzero, from 1 or −1 times frequency $f_P$; and by performing quadrature detection on each pixel of the image frame output from the signal processing unit using a signal having the frequency $f_P$ as a reference carrier wave, position dependence of, and changes in, the amplitude or phase of the high-frequency electric field signal are displayed, transmitted, or stored.

2. The electric field imaging device according to claim 1, further comprising a delay compensator configured to perform delay compensation for the high-frequency signal, the delay compensator being placed in an electrical signal path for the high-frequency signal, the electrical signal path running from the high-frequency signal input unit to the signal processing unit.

3. The electric field imaging device according to claim 1, wherein the information processing unit generates an image signal for a display image for the display device by using a value obtained by multiplying a phase signal separated from an image signal by a predetermined nonzero value.

4. The electric field imaging device according to claim 1, wherein the flashing signal generating unit (1) mixes a signal of predetermined frequency $f_{LO1}$ with a signal of frequency $f_{RF}$ received from the high-frequency signal input unit to generate a signal of frequency $(f_{IF2}=f_{RF}-f_{LO1})$ on a difference frequency side $(f_{RF}-f_{LO1})$; and (2) mixes the signal generated in (1) with a signal of frequency $f_{LO2}$ $(=f_{LO1}-f_{IF})$ differing by a predetermined frequency difference ($f_{IF}$ allowed to be either positive or negative) from the signal of frequency $f_{LO1}$ to generate a signal of frequency $(f_{LO}=f_{RF}-f_{IF})$ on a sum frequency side $(f_{IF2}+f_{LO2})$ and thereby generate a signal of frequency $(f_{LO})$ very close to frequency $f_{RF}$.

5. The electric field imaging device according to claim 1, wherein the flashing signal generating unit (1) mixes a signal of predetermined frequency $f_{LO1}$ with a signal of frequency $f_{RF}$ received from the high-frequency signal input unit to generate a signal of frequency $(f_{IF2}=f_{RF}+f_{LO1})$ on a sum frequency side $(f_{RF}+f_{LO1})$; and (2) mixes the signal generated in (1) with a signal of frequency $f_{LO2}$ $(=f_{LO1}-f_{IF})$ differing by a predetermined frequency difference ($f_{IF}$ allowed to be either positive or negative) from the signal of frequency $f_{LO1}$ to generate a signal of frequency $(f_{LO}=f_{RF}+f_{IF})$ on a difference frequency side $(f_{IF2}-f_{LO2})$ and thereby generate a signal of frequency $(f_{LO})$ very close to frequency $f_{RF}$.

6. The electric field imaging device according to claim 1, wherein one or more signals of the predetermined frequency independent of the sample are used by the flashing signal generating unit, the one or more signals each being generated by using a reference signal based on a clock that controls an imaging frame rate of the image capturing unit.

7. The electric field imaging device according to claim 2, wherein the information processing unit generates an image signal for a display image for the display device by using a value obtained by multiplying a phase signal separated from an image signal by a predetermined nonzero value.

* * * * *